(12) United States Patent
Arenella et al.

(10) Patent No.: US 10,167,891 B1
(45) Date of Patent: Jan. 1, 2019

(54) SELF-REPORTING, GROUNDED NUT-CLIP

(71) Applicant: International Business Machines Corporation, Armonk, NY (US)

(72) Inventors: Kenneth Arenella, Dutchess, NY (US); Marvin M. Misgen, Rochester, MN (US); Joseph F. Prisco, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/915,841

(22) Filed: Mar. 8, 2018

(51) Int. Cl.
    *H01R 4/66* (2006.01)
    *F16B 39/10* (2006.01)
    *H05K 7/18* (2006.01)
    *F16B 33/00* (2006.01)

(52) U.S. Cl.
    CPC ............ *F16B 39/10* (2013.01); *F16B 33/004* (2013.01); *H05K 7/18* (2013.01)

(58) Field of Classification Search
    CPC .......... H05K 7/18; F16B 39/10; F16B 33/004
    USPC ..... 439/92, 564, 565, 607.28, 927, 939, 488
    See application file for complete search history.

(56) References Cited

U.S. PATENT DOCUMENTS

| | | | | |
|---|---|---|---|---|
| 1,359,463 A | * | 11/1920 | Piersen | ................... H04L 15/16 |
| | | | | 178/17.5 |
| 2,114,067 A | * | 4/1938 | Mitchell | ................ B60K 37/06 |
| | | | | 116/246 |
| 2,219,846 A | * | 10/1940 | Meyer | .................... H01R 4/363 |
| | | | | 24/135 R |
| 2,371,592 A | * | 3/1945 | Gorey | ...................... G03B 9/08 |
| | | | | 396/387 |
| 2,375,059 A | * | 5/1945 | Williams et al. | ...... A61B 5/022 |
| | | | | 600/494 |

(Continued)

FOREIGN PATENT DOCUMENTS

| | | |
|---|---|---|
| CN | 203098530 U | 7/2013 |
| FR | 2697060 A1 | 4/1994 |

(Continued)

OTHER PUBLICATIONS

Anonymous, "Ground Conductivity Clip", IPCOM000194416D, Mar. 23, 2010, 4 pages.

(Continued)

*Primary Examiner* — Abdullah A Riyami
*Assistant Examiner* — Vladimir Imas
(74) *Attorney, Agent, or Firm* — Cantor Colburn LLP

(57) ABSTRACT

A self-reporting, grounded nut-clip is provided. The self-reporting, grounded nut-clip includes a support body. The support body includes first and second bends defining first, second and third support sections interleaved with the first and second bends. The first and third support sections define first and second apertures, respectively, and the second support section is interposed between the first and third support sections. The self-reporting, grounded nut-clip further includes a fastening element receiving member disposed on the first support section at the first aperture, a star washer, and an indicator. The star washer is disposed on the third support section at a location of the second aperture. The indicator is coupled to the third support section and is configured for automatic activation upon complete nut-clip installation.

20 Claims, 5 Drawing Sheets

(56) References Cited

U.S. PATENT DOCUMENTS

| | | | | |
|---|---|---|---|---|
| 2,664,475 A * | 12/1953 | Harlin | H01R 24/58 | 200/51.1 |
| 2,911,608 A * | 11/1959 | Lee | H01R 4/489 | 174/354 |
| 3,810,069 A * | 5/1974 | Jaconette, Jr. | F16B 37/041 | 439/97 |
| 3,885,847 A * | 5/1975 | Thibeault | H01R 4/64 | 439/97 |
| 4,256,359 A * | 3/1981 | Storck | H01R 12/68 | 174/78 |
| 4,260,849 A * | 4/1981 | Kirby | H05F 3/02 | 174/51 |
| 4,406,505 A * | 9/1983 | Avramovich | H01R 4/64 | 439/387 |
| 4,505,010 A * | 3/1985 | Arenhold | B25B 31/00 | 24/456 |
| 4,526,428 A * | 7/1985 | Sachs | H02G 7/053 | 24/115 R |
| 4,828,504 A * | 5/1989 | Franks, Jr. | B23K 37/0435 | 439/433 |
| 4,875,876 A * | 10/1989 | O'Loughlin | H01R 4/38 | 439/431 |
| 4,897,005 A * | 1/1990 | Peterson | F16B 37/02 | 411/112 |
| 5,094,622 A * | 3/1992 | Auclair | H01R 4/64 | 439/92 |
| 5,154,385 A * | 10/1992 | Lindberg | A47B 57/562 | 248/225.11 |
| 5,160,285 A * | 11/1992 | Murray | H01R 9/2633 | 439/115 |
| 5,207,588 A * | 5/1993 | Ladouceur | B23P 19/062 | 29/432.2 |
| 5,253,949 A * | 10/1993 | Oxley | B62D 1/16 | 403/155 |
| 5,371,819 A * | 12/1994 | Szegda | G02B 6/3887 | 385/101 |
| 5,377,558 A * | 1/1995 | Harris | B62J 23/00 | 180/84 |
| 5,442,133 A * | 8/1995 | Arnold | B23K 35/0288 | 174/51 |
| 5,494,456 A * | 2/1996 | Kozel | H01R 4/4827 | 439/439 |
| 5,616,036 A * | 4/1997 | Polidori | H01R 4/60 | 248/74.1 |
| 5,688,131 A * | 11/1997 | Byfield, Jr. | H01R 4/64 | 439/883 |
| 5,697,797 A * | 12/1997 | Wendel | H01Q 1/1214 | 411/342 |
| 5,704,805 A * | 1/1998 | Douty | H01R 9/2608 | 439/532 |
| 6,106,310 A * | 8/2000 | Davis | H01R 4/26 | 439/92 |
| 6,209,424 B1 * | 4/2001 | Croton | F16B 31/021 | 81/119 |
| 6,345,993 B1 * | 2/2002 | Lalaouna | H01R 9/031 | 439/92 |
| D459,302 S * | 6/2002 | Malin | D13/133 | |
| 6,431,885 B1 * | 8/2002 | Stroup | H01R 4/64 | 174/78 |
| 6,561,124 B1 * | 5/2003 | Marczynski | F16B 1/0071 | 116/306 |
| 6,648,698 B1 * | 11/2003 | Achtner | H01R 4/66 | 439/737 |
| 6,652,295 B1 * | 11/2003 | Glass | H01R 9/2483 | 439/92 |
| 6,709,280 B1 * | 3/2004 | Gretz | H02G 3/06 | 174/652 |
| 6,739,880 B2 * | 5/2004 | Toyota | H01R 12/523 | 174/138 G |
| 6,877,996 B1 * | 4/2005 | Franks, Jr. | H01R 4/42 | 439/782 |
| 6,957,968 B1 * | 10/2005 | Gretz | H01R 13/743 | 439/92 |
| 6,991,478 B2 * | 1/2006 | Girinon | B64D 45/02 | 439/92 |
| 6,994,586 B2 * | 2/2006 | Kanehira | H01R 4/64 | 174/138 D |
| 7,128,583 B2 * | 10/2006 | Tsuo | H01R 4/64 | 439/92 |
| 7,131,867 B1 * | 11/2006 | Foster | H01R 24/42 | 439/578 |
| 7,154,042 B2 * | 12/2006 | Auray | H01R 4/646 | 174/70 R |
| 7,381,105 B2 * | 6/2008 | Miekka | H01R 13/02 | 439/886 |
| 7,387,518 B2 * | 6/2008 | Kozlovski | F16B 5/0258 | 439/92 |
| 7,462,042 B2 * | 12/2008 | Chawgo | H01R 4/36 | 439/92 |
| 7,566,250 B1 * | 7/2009 | Good | H01R 4/32 | 174/78 |
| 7,670,153 B2 * | 3/2010 | Kulig | H01R 4/26 | 439/432 |
| 7,686,625 B1 * | 3/2010 | Dyer | H01R 4/64 | 439/857 |
| 7,753,697 B2 * | 7/2010 | Carlavan | B60R 16/06 | 439/92 |
| 7,857,269 B2 * | 12/2010 | Plaisted | F16L 3/127 | 248/237 |
| 7,988,464 B2 * | 8/2011 | Kossak | F16B 2/065 | 439/803 |
| 8,000,111 B2 * | 8/2011 | Liao | H05K 7/142 | 361/726 |
| 8,013,610 B1 * | 9/2011 | Merewether | G01V 3/101 | 324/329 |
| 8,096,816 B2 * | 1/2012 | Kossak | F16B 2/065 | 439/803 |
| 8,137,116 B2 * | 3/2012 | Omori | H01R 13/648 | 439/883 |
| 8,152,536 B2 * | 4/2012 | Scherer | H01L 31/02008 | 439/76.1 |
| 8,231,317 B2 * | 7/2012 | De Gelis | F16B 5/0225 | 411/174 |
| 8,436,243 B2 * | 5/2013 | Gattus | H02G 13/00 | 174/2 |
| 8,475,185 B2 * | 7/2013 | Rivera | F24J 2/4638 | 439/97 |
| 8,590,223 B2 * | 11/2013 | Kilgore | H01R 4/26 | 52/173.3 |
| 8,717,028 B1 * | 5/2014 | Merewether | G01V 3/101 | 324/329 |
| 8,777,538 B2 * | 7/2014 | Strizki | F16B 33/004 | 411/371.1 |
| 8,806,813 B2 * | 8/2014 | Plaisted | H01L 31/0422 | 52/173.3 |
| 8,888,431 B2 * | 11/2014 | Haney | H01R 43/027 | 411/163 |
| 8,918,993 B2 * | 12/2014 | Braden | H01R 4/646 | 29/844 |
| 8,955,259 B2 * | 2/2015 | Hemingway | F24S 25/61 | 52/24 |
| 9,151,315 B2 * | 10/2015 | McPheeters | F16B 37/14 | |
| 9,160,085 B2 * | 10/2015 | Jun | H01R 4/4827 | |
| 9,178,288 B2 * | 11/2015 | Gao | H01R 4/4809 | |
| 9,459,135 B2 * | 10/2016 | Kirita | G01G 19/4142 | |
| 9,595,772 B2 * | 3/2017 | Haney | H01R 43/027 | |
| 9,673,602 B2 * | 6/2017 | Serdynski | H02G 3/081 | |
| 9,880,309 B2 * | 1/2018 | Merewether | G01V 3/101 | |
| 9,958,586 B2 * | 5/2018 | Kosarnig | E03D 11/143 | |
| 10,051,767 B2 * | 8/2018 | Yoon | H05K 9/0067 | |
| 2003/0169160 A1 * | 9/2003 | Rodriguez Barros | B60Q 1/2665 | 340/426.1 |
| 2007/0093121 A1 * | 4/2007 | Helmreich | H01H 50/14 | 439/495 |
| 2014/0065892 A1 * | 3/2014 | Jun | H01R 4/4827 | 439/787 |

(56) References Cited

U.S. PATENT DOCUMENTS

| | | | |
|---|---|---|---|
| 2015/0104239 A1 | 4/2015 | Schaefer et al. | |
| 2015/0144053 A1* | 5/2015 | Riccardella | B01D 35/143 116/268 |
| 2015/0349166 A1 | 12/2015 | Reynolds et al. | |
| 2016/0268958 A1* | 9/2016 | Wildes | H02S 20/23 |
| 2017/0074312 A1 | 3/2017 | Thielmann et al. | |

FOREIGN PATENT DOCUMENTS

| | | | |
|---|---|---|---|
| GB | 982132 | A | 4/1961 |
| GB | 2343726 | A | 5/2000 |
| JP | 2767215 | B2 | 6/1998 |

OTHER PUBLICATIONS

Anonymous, "Star Washer Fasteners", IBM TDB 09-84 p. 2381-2382, IPCOM000043693D, Feb. 5, 2005, 3 pages.

* cited by examiner

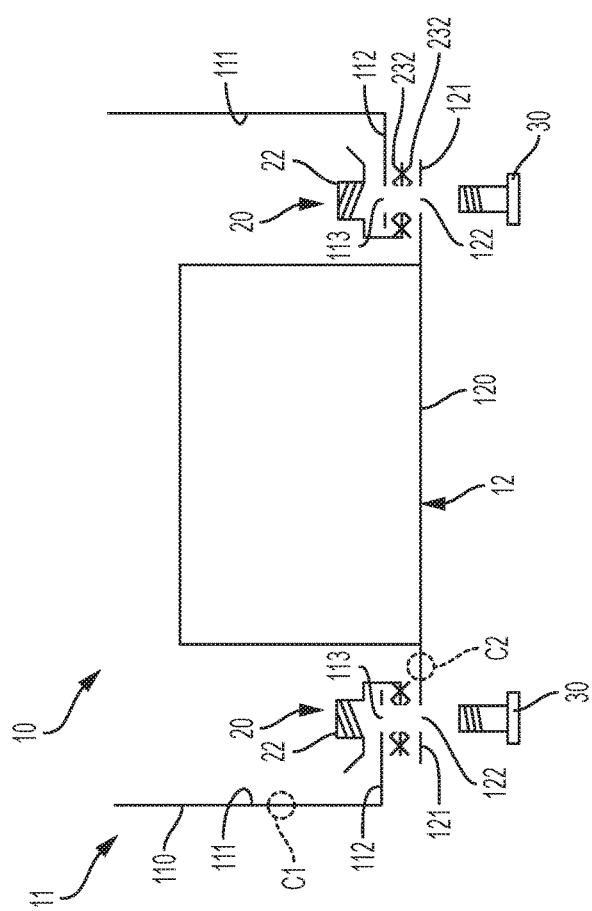
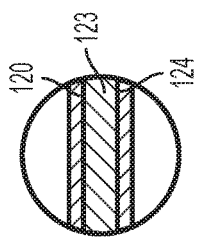
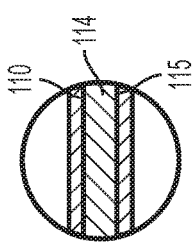
FIG. 1A
FIG. 1B
FIG. 1C

SELF-REPORTING, GROUNDED NUT-CLIP

BACKGROUND

The present invention generally relates to nut-clips, and more specifically, to a self-reporting, grounded nut-clip.

A rack is a frame or enclosure that is configured for mounting multiple electronic equipment modules inside of an interior. The electronic equipment modules can include servers, telecommunication relays, etc. Equipment designed to be placed in a rack is typically described as rack mounted, a rack mounted instrument, a rack mounted system, a rack mount chassis, a sub-rack, rack mountable or occasionally as simply shelf equipment.

SUMMARY

Embodiments of the present invention are directed to a self-reporting, grounded nut-clip. A non-limiting example of the self-reporting, grounded nut-clip includes a support body. The support body includes first and second bends defining first, second and third support sections interleaved with the first and second bends. The first and third support sections define first and second apertures, respectively, and the second support section is interposed between the first and third support sections. The non-limiting example of the self-reporting, grounded nut-clip further includes a fastening element receiving member disposed on the first support section at the first aperture, a star washer, and an indicator. The star washer is disposed on the third support section at a location of the second aperture. The indicator is coupled to the third support section and is configured for automatic activation upon complete nut-clip installation.

Embodiments of the present invention are directed to a structural assembly. A non-limiting example of the structural assembly includes first and second structures having first and second flanges, respectively, the first and second flanges defining first and second through-holes, respectively. The first and second structures each include electrically conductive materials and paint covering the electrically conductive materials proximate to the first and second through-holes. The first and second structures are each disposable with the first and second through-holes aligned. The non-limiting example of the structural assembly includes a self-reporting, grounded nut-clip defining apertures disposable in alignment with the first and second through-holes. The self-reporting, grounded nut-clip includes a star washer and an indicator configured for automatic activation upon complete nut-clip installation. The structural assembly further includes a fastening element configured for extension through the first and second through-holes and for engagement with the apertures to tighten the first and second flanges onto opposite sides of the star washer such that the opposite sides of the star washer electrically contact the conductive materials through the paint.

Embodiments of the present invention are directed to a structural assembly method. A non-limiting example of the structural assembly method includes arranging first and second rack mount structures having first and second flanges, respectively, which define first and second through-holes, respectively, such that the first and second through-holes are aligned. The non-limiting example of the structural assembly method further includes disposing a self-reporting, grounded nut-clip including a star washer and an indicator configured for automatic activation upon complete nut-clip installation and defining apertures such that the apertures align with the first and second through-holes. In addition, the non-limiting example of the structural assembly method further includes engaging a fastening element with the apertures to tighten the first and second flanges onto opposite sides of the star washer such that the opposite sides of the star washer electrically contact first and second electrically conductive materials of the first and second rack mount structures, respectively, through paint overlying the first and second electrically conductive materials and continuing the engaging until the indicator automatically activates.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1A is a schematic, top-down view of a rack mount assembly according to embodiments of the invention;

FIG. 1B is an enlarged view of the portion of FIG. 1A encircled by circle C1;

FIG. 1C is an enlarged view of the portion of FIG. 1A encircled by circle C2;

Figure 2:
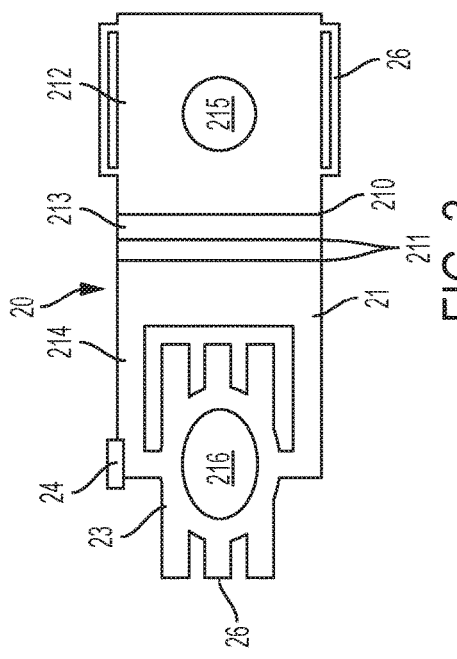
FIG. 2 is a schematic, front view of a self-reporting, grounded nut-clip according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost

DETAILED DESCRIPTION

Turning now to an overview of technologies that are more specifically relevant to aspects of the invention, rack systems can be made of generally very high value components and can be configured as storage racks, racks for mainframes, racks for computers, racks for security appliances, etc.

A large portion of information technology (IT) and telecommunications equipment is stored in rack systems that are often subject to Electronics Industry Alliance Standard 310-D (or IEC 60297). In such rack systems, the face (or ears) of rackable equipment is pushed up against and held to rails by screws through multiple hole locations. Originally, these rails were threaded at each hole location but this has changed over time due to the fact that rails need to be thicker to tap, which adds cost and weight, and the additional machining required increases manufacturing time. Multiple ad-hoc standards for the threading emerged (10-32, 12-23, M6, etc.) and this leads to incompatibilities between rack systems.

Rack systems then began to be designed with thinner metallic components (e.g., rails) and unthreaded holes that require clips. However, since rail thicknesses vary, since clips are often formed with spring steel and can be difficult to deal with and since clips typically must be bent past their elastic limits for removal, these solutions presented additional issues, such as cost pressures. Proper electrical bonding can be addressed by "masking off" the rails but this adds even further costs in setup before painting. Painted rails allow for cheaper alloys without anti-corrosive properties to be used.

In any case, while modern rack systems can be inexpensive and faster to produce than rack systems used to be, grounding suitability of rack systems has become degraded. As such, rackable equipment that must be redundantly grounded ends up being provided with ground straps, which have numerous problems of their own: customers forget to install them or do not know what they are for, customers (or trained installers) use them initially but untrained personnel later remove them and do not reinstall them properly, customers install them non-uniformly, leading to a confusing state where some equipment is grounded and other equipment is ungrounded and it is not always easy to confirm good contact without test equipment Turning now to an overview of the aspects of the invention, one or more embodiments of the invention address the need for assembly certain structures together, for grounding those structures and for providing a visible indication of a good assembly.

With reference to FIGS. 1A, 1B, 1C, 2 and 3, a structural assembly 10 is provided for use with multiple structural articles including, for example, rack mount systems and automobiles. The following description will generally relate to the structural assembly 10 being provided for use with rack mount systems but it is to be understood that this is merely exemplary and that other embodiments exist.

The structural assembly 10 includes a first structure 11 and a second structure 12. The first structure 11 can be provided as a rack enclosure 110 and includes opposite sidewalls 111 and a pair of first flanges 112 extending inwardly from forward-most edges of the opposite sidewalls 111. Each of the first flanges 112 is formed to define first through-holes 113. The first structure 11 can include various materials but particularly includes electrically conductive materials 114 and paint 115 covering the electrically conductive materials 114 at least at locations proximate to the first through-holes 113 (see FIG. 1B). The second structure 12 can be provided as a rackable unit 120 and includes a pair of second flanges 121 extending outwardly from opposite sides of the rackable unit 120. Each of the second flanges 121 is formed to define second through-holes 122. The second structure 12 can include various materials but particularly includes electrically conductive materials 123 and paint 124 covering the electrically conductive materials 123 at least at locations proximate to the second through-holes 122.

The first structure 11 and the second structure 12 can each be disposed with the first through-holes 113 and the second through-holes 122 aligned with each other.

The structural assembly 10 also includes a pair of self-reporting, grounded nut-clips 20 for respective association each of the aligned sets of first and second through-holes 113 and 122 and a pair of fastening elements 30 for respective association with each of the self-reporting, grounded nut-clips 20. That is, a self-reporting, grounded nut-clip 20 can be provided for the first and second through-holes 113 and 122 at one side of the rackable unit 120 and an additional self-reporting, grounded nut-clip 20 can be provided for the first and second through-holes 113 and 122 at the opposite side of the rackable unit 120.

Figure 3:
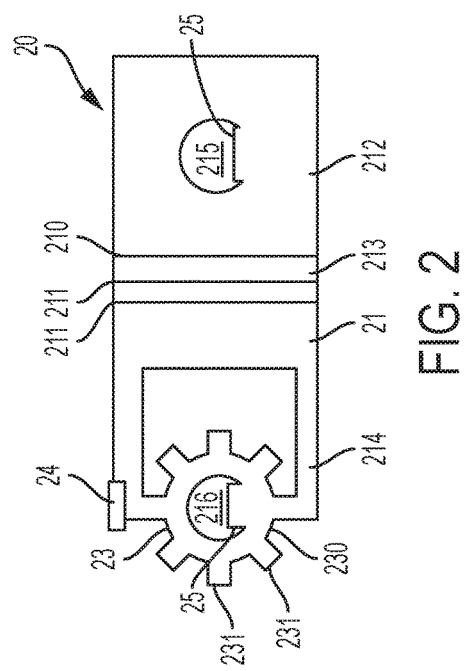
FIG. 3 is a schematic, front view of a self-reporting, grounded nut-clip according to embodiments of the invention.
Figure 4:
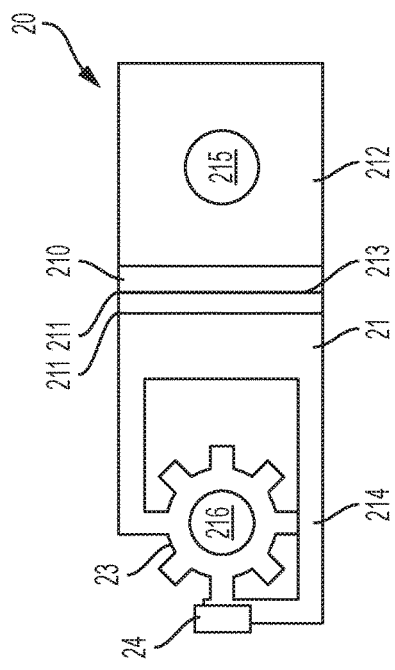
FIG. 4 is a schematic, front view of a self-reporting, grounded nut-clip according to embodiments of the invention.

With continued reference to FIGS. 2 and 3 and with additional reference to FIG. 4, each self-reporting, grounded nut-clip 20 can be formed of plastic and/or metallic materials and can include a support body 21, a fastening element receiving member 22 (see FIG. 1), a star washer 23 and an indicator 24. The support body 21 includes first and second bends 210 and 211 that define and delimit first, second and third support sections 212, 213 and 214, which are respectively interleaved with the first and second bends 210 and 211. The first support section 212 is formed to define a first aperture 215. The third support section 214 is formed to define a second aperture 216. The second support section 213 acts as a spine and is interposed between the first support section 212 and the third support section 214. The fastening element receiving member 22 is disposed on the first support section 212 at, near or about the first aperture 215. The star washer 23 is disposed on the third support section 214 at, near or about a location of the second aperture 216. The indicator 24 is coupled to a top (see FIGS. 2 and 3) or a side (see FIG. 4) of the third support section 214 and is configured for automatic activation to be visible to an operator upon complete nut-clip installation.

As shown in FIGS. 1 and 3, the star washer 23 can include a ring-shaped hub 230 and spiked spokes 231 extending radially outwardly from the ring-shaped hub 230. Each of the spiked spokes 231 includes a pair of opposing axial spikes 232 that extend out of the plane of the ring-shaped hub 230 and the spiked spokes 231 in opposite axial directions.

In accordance with embodiments and, as shown in FIG. 2, the first and second through-holes 113 and 122 are annular or circular. In these cases, each self-reporting, grounded nut-clip 20 can include internal fixture tabs 25. In accordance with embodiments and, as shown in FIG. 3, the first and second through-holes 113 and 122 are angular or rectangular. In these cases, each self-reporting, grounded nut-clip 20 can include external fixture tabs 26.

In accordance with embodiments, the fastening element receiving member 22 can be provided with a threaded interior that can engage with a threaded exterior of a corresponding one of the fastening elements 30 (the ring-shaped hub 230 of the star washer 23 can also be provided with a threaded interior that can engage with the threaded exterior of the corresponding one of the fastening elements 30). Thus, where the self-reporting, grounded nut-clip 20 is disposed to register with the first and second flanges 112 and 121 such that the first and second apertures 215 and 216 align with the first and second through-holes 113 and 122, the corresponding one of the fastening elements 30 is extendable through the first and second through-holes 113 and 122 and is configured for engagement with the apertures first and second apertures 215 and 216. Such extension and engagement result in the first and second flanges 112 and 121 tightening onto opposite sides of the star washer 23 as the fastening elements 30 are rotated about their respective longitudinal axes. The opposing axial spikes 232 that extend out of the plane of the ring-shaped hub 230 and the spiked spokes 231 in opposite axial directions, therefore, penetrate through the paint 115 and 124 to electrically contact the conductive materials 114 and 123.

The action of tightening the first and second flanges 112 and 121 onto the opposite sides of the star washer 23 activates the indicator 24. Similarly, the action of the opposing axial spikes 232 penetrating through the paint 115 and 124 or other non-conductive coating to electrically contact the conductive materials 114 and 123 serves to ground the structural assembly 10. In accordance with embodiments, the timing of the self-reporting, grounded nut-clip 20 can be configured such that the tightening of the first and second flanges 112 and 121 onto the opposite sides of the star washer 23 does not activate the indicator 24 until the opposing axial spikes 232 penetrate through the paint 115 and 124 to electrically contact the conductive materials 114 and 123 and to thereby ground the structural assembly 10. Therefore, the indicator 24 effectively operates as an indicator that is visible to the operator that the structural assembly 10 has been properly grounded.

With reference to FIGS. 2-4 and 5, at least the second bend 211 can be plural in number with the plural second bends 211 arranged as a sequence of plural second bends 211 at varying distances from the first bend 210. As such, where the first and third support sections 212 and 214 are substantially parallel (see, e.g., FIG. 1), a distance between the first and third support sections 212 and 214 is defined based on which of the plural second bends 211 is employed to wrap around the first or second flange 112 or 121.

Figure 5:
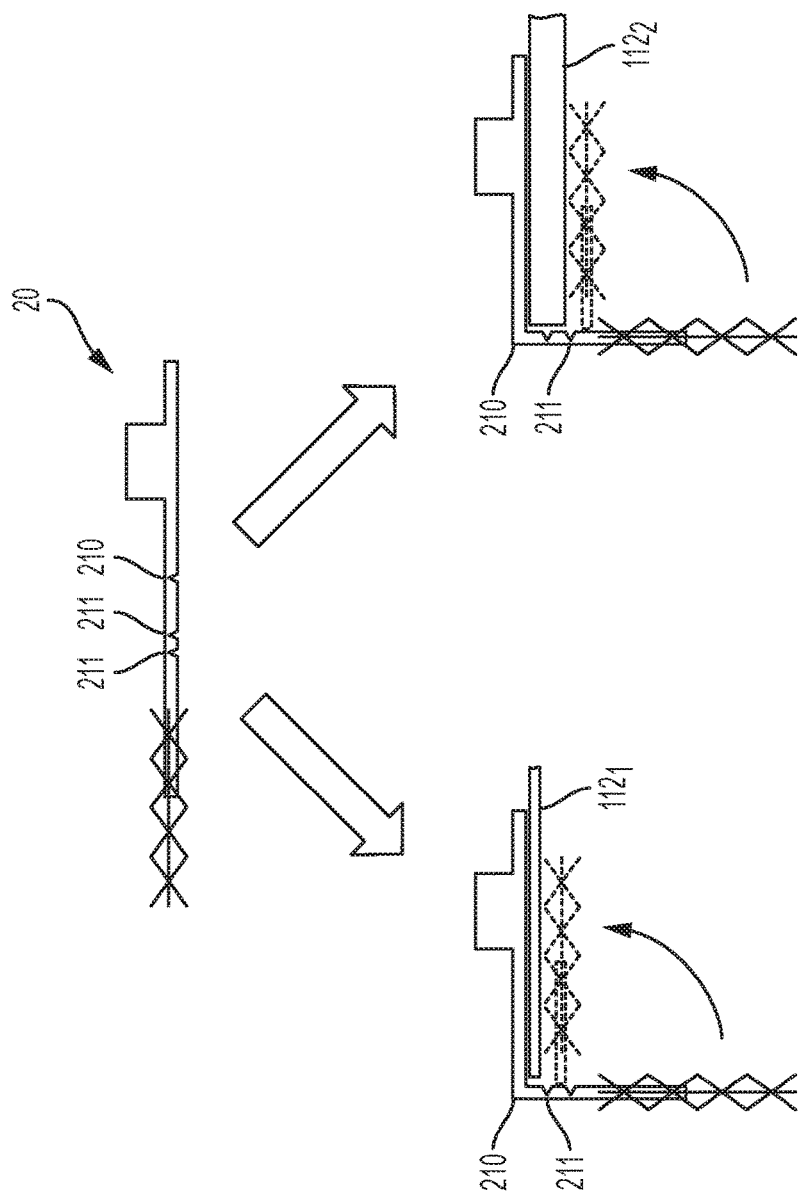
FIG. 5 is an illustration of an installation process of the self-reporting grounded nut-clip of FIGS. 1A, 1B, 1C, 2, 3 and 4.

As shown in FIG. 5, each self-reporting, grounded nut-clip 20 is usable with first flanges $112_{1,2}$ of varying thicknesses. Each self-reporting, grounded nut-clip 20 is initially provided as a substantially straight feature with a first bend 210 and plural second bends 211 available but not formed into angles. When the self-reporting, grounded nut-clip 20 is to be installed, the first bend 210 is formed into a right angle, for example, that will align with a first edge of the first and second flanges $112_{1,2}$. The second bend 211 is formed thereafter as a right angle that will align with a second edge of the first flange $112_1$ at a distance from the first bend 210 which is in accordance with the thickness of the first flange $112_1$. Alternately, the second bend 211 is formed as a right angle that will align with a second edge of the second flange $112_2$ at a distance from the first bend 210 which is in accordance with the thickness of the second flange $112_2$.

Figure 6:
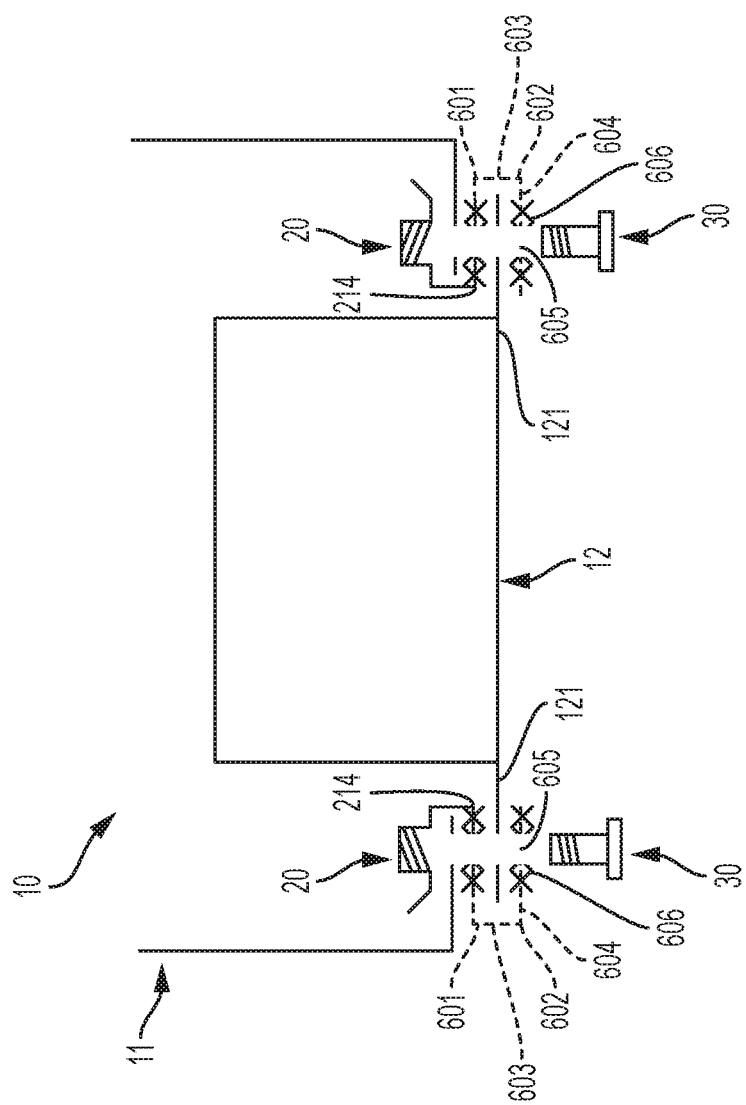
FIG. 6 is a schematic, top-down view of a rack mount assembly according to further embodiments of the invention.

Final configurations of each self-reporting, grounded nut-clip 20 following completion of the second bend 211 can be seen in the dashed details of the lower images of FIG. 5 and schematically in FIGS. 1 and 6, for example.

With reference to FIG. 6, the support body 21 can further include third and fourth bends 601 and 602 defining fourth and fifth support sections 603 and 604 interleaved with the third and fourth bends 601 and 602. The fifth support section 604 is formed to define a third aperture 605 and the fourth support section is interposed between the third support section 214 and the fifth support section 604. An additional star washer 606 is disposed on the fifth support section 604 at a location of the third aperture 605. Here, the spiked spokes of the additional star washer 606 penetrate the paint 124 to electrically contact the electrically conductive materials 123 on an exterior of the second flanges 121 to provide a redundant grounding feature structural assembly 10.

Figure 7:
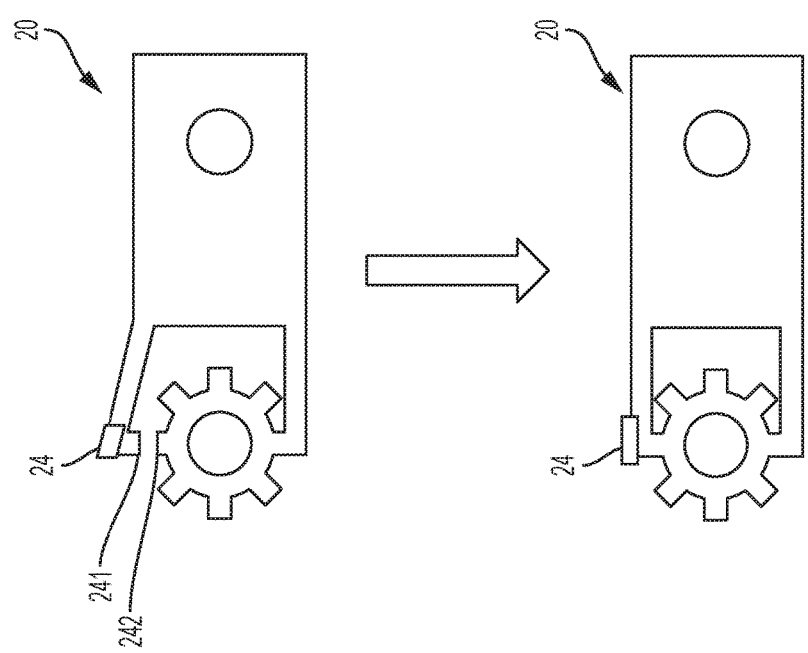
FIG. 7 is a schematic illustration of an operation of an indicator of a self-reporting, grounded nut-clip according to embodiments of the invention.

With reference to FIG. 7, the indicator 24 can include complementary bezel surfaces 241 and 242. Prior to installation of the self-reporting, grounded nut-clip 20, the complementary bezel surfaces 241 and 242 are separated from one another. Subsequently, during installation of the self-reporting, grounded nut-clip 20, the complementary bezel surfaces 241 and 242 are forced together to thereby automatically activate the indicator 24.

Figure 8:
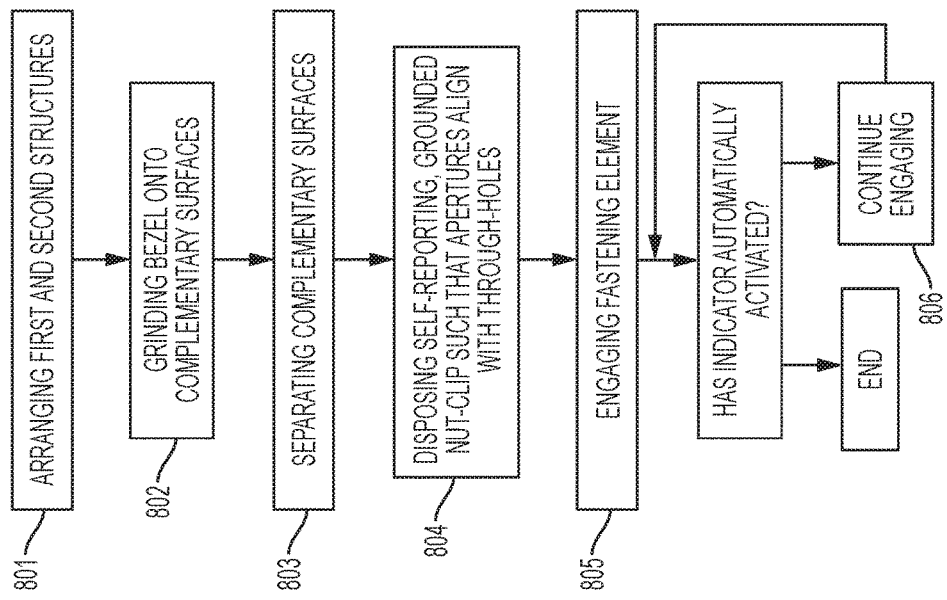
FIG. 8 is a flow diagram of a structural assembly method according to embodiments of the invention.

With reference to FIG. 8, a structural assembly method is provided for assembling the structural assembly 10 described herein. As shown in FIG. 8, the structural assembly includes arranging first and second structures having first and second flanges, respectively, which define first and second through-holes, respectively, such that the first and second through-holes are aligned (block 801). The structural assembly method further includes disposing a self-reporting, grounded nut-clip that includes a star washer and an indicator configured for automatic activation upon complete nut-clip installation and defining apertures such that the apertures align with the first and second through-holes (block 802). In addition, the structural assembly method includes engaging a fastening element with the apertures to tighten the first and second flanges onto opposite sides of the star washer such that the opposite sides of the star washer electrically contact first and second electrically conductive materials of the first and second rack mount structures, respectively, through paint overlying the first and second electrically conductive materials (block 803) and continuing the engaging until the indicator automatically activates (block 804). In accordance with embodiments, the structural assembly method also includes grinding a bezel onto complementary edges of the star washer and a local nut-clip component (block 805) and separating the complementary edges such that the complementary edges are forced together during the nut-clip installation (block 806).

The description provided above relates to a self-reporting, grounded nut-clip that serves to ground a structural assembly to which it is attached and provides a visible indication to an operator that it has been completely installed.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A self-reporting, grounded nut-clip, comprising:
    a support body comprising first and second bends defining first, second and third support sections interleaved with the first and second bends,
    the first and third support sections defining first and second apertures, respectively, and the second support section being interposed between the first and third support sections;
    a fastening element receiving member disposed on the first support section at the first aperture;
    a star washer disposed on the third support section at a location of the second aperture; and
    an indicator coupled to the third support section and which is configured for automatic activation upon complete nut-clip installation.

2. The self-reporting, grounded nut-clip according to claim 1, wherein the second bend is plural in number and arranged as a sequence of plural second bends at varying distances from the first bend.

3. The self-reporting, grounded nut-clip according to claim 1, further comprising at least one of:
    internal fixture tabs coupled to the first and third support sections; and
    external fixture tabs coupled to the first and third support sections.

4. The self-reporting, grounded nut-clip according to claim 1, wherein the star washer comprises:
    a ring-shaped hub; and
    spiked spokes extending radially outwardly from the ring-shaped hub.

5. The self-reporting, grounded nut-clip according to claim 4, wherein the spiked spokes each comprise a pair of opposing axial spikes.

6. The self-reporting, grounded nut-clip according to claim 1, wherein the indicator is coupled to one of a top and a side of the third support section.

7. The self-reporting, grounded nut-clip according to claim 1, wherein the indicator comprises complementary bezel surfaces.

8. The self-reporting, grounded nut-clip according to claim 1, wherein:
    the support body further comprises third and fourth bends defining fourth and fifth support sections interleaved with the third and fourth bends,
    the fifth support section defining a third aperture and the fourth support section being interposed between the third and fifth support sections; and
    an additional star washer disposed on the fifth support section at a location of the third aperture.

9. A structural assembly, comprising:
    first and second structures having first and second flanges, respectively, the first and second flanges defining first and second through-holes, respectively,
    the first and second structures each comprising electrically conductive materials and paint covering the electrically conductive materials proximate to the first and second through-holes and each being disposable with the first and second through-holes aligned;
    a self-reporting, grounded nut-clip defining apertures disposable in alignment with the first and second through-holes and comprising:
        a star washer; and
        an indicator configured for automatic activation upon complete nut-clip installation; and
    a fastening element configured for extension through the first and second through-holes and for engagement with the apertures to tighten the first and second flanges onto opposite sides of the star washer such that the opposite sides of the star washer electrically contact the electrically conductive materials through the paint.

10. The structural assembly according to claim 9, wherein:
    the first structure comprises a rack enclosure and the first flange comprises a pair of inwardly extending first flanges, and
    the second structure comprises a rackable unit and the second flange comprises a pair of outwardly extending second flanges.

11. The structural assembly according to claim 10, wherein the self-reporting, grounded nut-clip and the fastening element are provided as respective pairs thereof.

12. The structural assembly according to claim 9, wherein:
    the first and second through-holes are annular and the self-reporting, grounded nut-clip comprises internal fixture tabs, or
    the first and second through-holes are angular and the self-reporting, grounded nut-clip comprises external fixture tabs.

13. The structural assembly according to claim 9, wherein the self-reporting, grounded nut-clip, comprises:
    a support body comprising first and second bends defining first, second and third support sections interleaved with the first and second bends,
    the first and third support sections defining the apertures as first and second apertures, respectively, and the second support section being interposed between the first and third support sections; and
    a fastening element receiving member disposed on the first support section at the first aperture,
    wherein the star washer is disposed on the third support section at a location of the second aperture and the indicator is coupled to the third support section.

14. The structural assembly according to claim 13, wherein the second bend is plural in number and arranged as a sequence of plural second bends at varying distances from the first bend.

15. The structural assembly according to claim 13, wherein the star washer comprises:
    a ring-shaped hub; and
    spiked spokes extending radially outwardly from the ring-shaped hub.

16. The structural assembly according to claim 15, wherein the spiked spokes each comprise a pair of opposing axial spikes.

17. The structural assembly according to claim 13, wherein the indicator is coupled to one of a top and a side of the third support section.

18. The structural assembly according to claim 13, wherein the indicator comprises complementary bezel surfaces.

19. A structural assembly method, comprising:
    arranging first and second structures having first and second flanges, respectively, which define first and second through-holes, respectively, such that the first and second through-holes are aligned;
    disposing a self-reporting, grounded nut-clip comprising a star washer and an indicator configured for automatic activation upon complete nut-clip installation and defining apertures such that the apertures align with the first and second through-holes;
    engaging a fastening element with the apertures to tighten the first and second flanges onto opposite sides of the star washer such that the opposite sides of the star washer electrically contact first and second electrically conductive materials of first and second rack mount structures, respectively, through paint overlying the first and second electrically conductive materials; and continuing the engaging until the indicator automatically activates.

20. The structural assembly method according to claim 19, further comprising:

grinding a bezel onto complementary edges of the star washer and a local nut-clip component; and separating the complementary edges such that the complementary edges are forced together during the nut-clip installation.

\* \* \* \* \*